United States Patent [19]

Bergeron et al.

[11] 4,110,126
[45] Aug. 29, 1978

[54] NPN/PNP FABRICATION PROCESS WITH IMPROVED ALIGNMENT

[75] Inventors: David Leo Bergeron, Manassas; Zimri Congdon Putney, Fairfax; Geoffrey Brownell Stephens, Catlett, all of Va.

[73] Assignee: International Business Machines Corporation, Armonk, N.Y.

[21] Appl. No.: 829,302

[22] Filed: Aug. 31, 1977

[51] Int. Cl.² ........................................... H01L 21/265
[52] U.S. Cl. ..................................... 148/1.5; 148/175; 148/187; 357/34; 357/91; 357/92
[58] Field of Search ...................... 357/51, 92, 91, 34; 148/1.5, 187, 175

[56] References Cited

U.S. PATENT DOCUMENTS

| | | | |
|---|---|---|---|
| 3,725,150 | 4/1973 | George | 148/187 |
| 3,833,429 | 9/1974 | Monma et al. | 148/1.5 |
| 3,891,480 | 6/1975 | Fulkerson | 148/187 |
| 3,928,081 | 12/1975 | Marley, Jr. et al. | 148/1.5 |
| 3,928,082 | 12/1975 | Schwettmann et al. | 148/1.5 |
| 3,933,528 | 1/1976 | Sloan, Jr. | 148/1.5 |
| 3,951,693 | 4/1976 | Fisher et al. | 148/1.5 |
| 3,971,059 | 7/1976 | Dunkley et al. | 357/44 |
| 4,009,057 | 2/1977 | Brebisson | 148/1.5 |
| 4,021,270 | 5/1977 | Hunt et al. | 148/1.5 |
| 4,046,606 | 9/1977 | Lambert | 148/187 |

*Primary Examiner*—R. Dean
*Assistant Examiner*—Upendra Roy

*Attorney, Agent, or Firm*—John E. Hoel

[57] ABSTRACT

An improved merged transistor logic (I²L) process is disclosed which provides a practical technique for forming micron to sub-micron window size devices. In a single step, the process forms all of the contact and guard ring windows in the passivation layer and then by use of selective blocking of various combinations of these windows, the various ion-implanted regions of the devices are formed with a minimum number of hot processing steps. A second embodiment of the method forms a double diffused lateral PNP device having an asymmetrically placed emitter within the base so as to enhance the injection efficiency in the vicinity of the collector. A micron to sub-micron window for the formation of all contacts and guard ring permits a merged transistor logic structure to be formed having a reduced upward NPN collector-base capacitance, lower PNP emitter-base diffusion capacitance, a lower PNP base series resistance, and an increased probability of avoiding collector-emitter pipe defects. The formation of all the windows in the passivation layer and the use of selective photoresist blocking to define the various ion-implanted regions in the device permit the practical formation of a minimum size (self-aligned contact to guard ring) MTL device with a minimum number of critical mask and hot processing steps. The advantages also apply to downward NPN and individual PNP devices.

6 Claims, 27 Drawing Figures

NPN/PNP FABRICATION PROCESS WITH IMPROVED ALIGNMENT

FIELD OF THE INVENTION

The invention generally relates to semiconductor manufacturing processes and more particularly relates to a process for forming improved bipolar transistors.

BACKGROUND OF THE INVENTION

A reduction in the size of the mask windows would permit a merged transistor logic structure to be formed having a reduced PNP emitter-base diffusion capacitance, a lower upward NPN collector-base capacitance, a lower PNP base series resistance, and an increased probability of avoiding collector-emitter pipe defects. However, the prior art has been unable to form self-aligned contact and guard ring windows on the order of one-micron or less across so as to permit the practical formation of a minimum size (self-aligned) MTL device with a minimum number of critical masks and hot processing steps.

U.S. Pat. No. 4,009,057 to Brebisson, et al. discloses a process for forming a vertical NPN transistor which employs the step of forming an oxide layer 4, through which all of the contact holes are etched, followed by sequential steps of selectively blocking various combinations of those windows with a photoresist layer 6, and ion-implanting structures through the openings in the photoresist. Brebisson, et al. removes the masking oxide layer and later forms a passivation layer. Brebisson, et al. cannot make a double diffused lateral PNP as a thick oxidation layer 6, around the oxidation impervious nitride masking layers 5, since it forms the well-known "birds-beak" configuration which would consume the lateral PNP base. In addition, the thickness of the oxide layer 4, approximately 6000 Angstroms, would cause the nitride layer 5 to pop off for window sizes of approximately one-micron. Furthermore, the stress in the emitter-base region of the lateral PNP due to the displacement of the nitride layer 5 by the oxide layer 4, would cause increased recombination sites to form by degrading the performance of the resulting device, especially in low current operation.

This prior art process is considered an impractical and quite likely unworkable process as may be seen from FIG. 7 where nitride layer 14b2 must be lifted off the oxide layer 4P by means of etching underneath the nitride layer, a questionable process having a low yield.

OBJECTS OF THE INVENTION

It is therefore an object of the invention to provide a micron to sub-micron window size for a semiconductor device.

It is another object of the invention to provide a micron to sub-micron window size for a semiconductor device with a minimum number of hot process steps.

It is another object of the invention to form a guard ring which is self-aligned to all contacts and top down only isolation regions.

It is another object of the invention to form a double diffused PNP whose base is compatible with the reach through/guard ring of the NPN device, and whose collector is compatible with the base of the NPN, and whose emitter is compatible with the base contact of the NPN.

It is another object of the invention to form an MTL structure with lower PNP emitter-base diffusion capacitance and lower series base resistance.

It is still another object to form a merged transistor logic structure with a reduced collector-base capacitance for the upward injecting NPN and an increased probability of avoiding collector-emitter pipe defects.

SUMMARY OF THE INVENTION

These and other objects are accomplished by the improved merged transistor logic ($I^2L$) process disclosed which provides a practical technique for forming micron to sub-micron window size devices. In a single step, the process forms all of the contact and guard ring windows in the passivation layer and then by use of selective blocking of various combinations of these windows, the various ion-implanted regions of the devices are formed with a minimum number of critical masks and hot processing steps. A second embodiment of the method forms a double diffused lateral PNP device having an asymmetrically placed emitter within the base so as to enhance the injection efficiency in the vicinity of the collector. A micron to sub-micron window for the formation of all contacts and guard ring permits a merged transistor logic structure to be formed having a reduced upward NPN collector-base capacitance, a lower PNP emitter-base diffusion capacitance, a lower PNP base series resistance, and an increased probability of avoiding collector-emitter pipe defects. The formation of all the windows in the passivation layer and the use of selective photoresist blocking to define the various ion-implanted regions in the device, permit the practical formation of a minimum size MTL and individual NPN/PNP devices with a minimum number of critical masks and hot processing steps.

DESCRIPTION OF THE FIGURES

These and other objects will be more fully understood with reference to the accompanying drawings.

In this embodiment (3a–3i), it is preferred to overlap the PNP base region with the PNP collector to eliminate unwanted injection into the N-epi. The photo layer 56 from FIG. 1f is thereby eliminated.

DISCUSSION OF THE PREFERRED EMBODIMENT

An improved merged transistor logic ($I^2L$) process is disclosed which provides a practical technique for forming 1-micron window size devices. In a single step, the process forms all of the contact and guard ring windows in the passivation layer and then by use of selective blocking of various combinations of these windows, the various ion-implanted regions of the devices are formed with a minimum number of hot processing steps. A second embodiment of the method forms a double diffused lateral PNP device having an asymmetrically placed emitter within the base so as to enhance the injection efficiency in the vicinity of the collector. Micron to sub-micron windows for the formation of contacts and guard ring permit a merged transistor logic structure to be formed having a reduced upward NPN collector-base capacitance, a lower PNP emitter-base diffusion capacitance, a lower PNP base series resistance, and an increased probability of avoiding collector-emitter pipe defects. The formation of all the windows in the passivation layer, and the use of selective photoresist blocking to define the various ion-implanted regions in the device, permit the practical formation of a minimum size (self aligned) MTL device with a minimum number of critical masks and hot processing steps. The disclosed process eliminates second order alignment of critical regions in integrated circuits, self-aligns PNP emitter to PNP base and self-aligns N guard ring to all contact holes and top only isolation (if used).

A semiconductor fabrication process is described for simultaneous formation of high performance NPN and PNP transistors with improved alignment of doped regions. The invention makes use of the well-known properties of silicon nitride to mask oxide growth as well as serve as an etch mask for $SiO_2$. The process is compatible with Schottky Barrier Diodes (SBD), MTL N guard ring formation, as well as high value resistors (NPN base sheet resistance is on the order of 1000 ohms/sq).

Figure 1A:
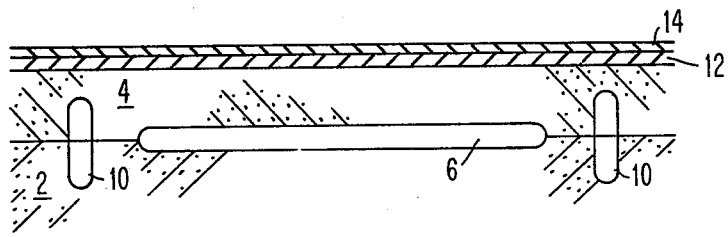
FIG. 1a is a cross-sectional view of a first intermediate stage of the $I^2L$ device with a conventional buried N+ region, P+ bottom isolation, and N-Epi formation, followed by $SiO_2$ oxidation and $Si_3N_4$ deposition.

In FIG. 1a, the process follows conventional masking, doping (diffusion or ion implant) and deposition techniques to form the N+ 6 and P+ 10 buried regions, N-epitaxial layer 4, on substrate 2, epi reoxidation 12, and $Si_3N_4$ layer 14.

Figure 1B:
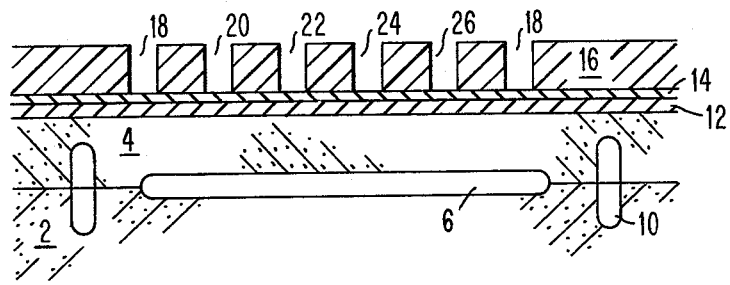
FIG. 1b is a cross-sectional view of a second stage opening all contacts and N guard ring regions through the $Si_3N_4$ layer.
Figure 1C:
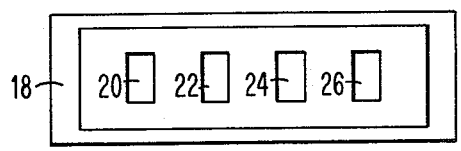
FIG. 1c is a top view of the second intermediate stage opening of all contacts and N guard ring regions through the $Si_3N_4$ layer.

In FIG. 1b, all contact holes 20, 22, 24, 26, and N guard ring (if used) 18 are etched (reactive ion etching (RIE) is preferred) through $Si_3N_4$ 14 using photoresist mask 16. FIG. 1c shows a top view of this mask.

As an alternate step (not shown), if the P+ isolation is formed only from the top surface, these regions are opened during this step as well. After photoresist 16 (PR) removal, a PR blocking mask is formed and top isolation only windows are etched through $SiO_2$ 12 using $Si_3N_4$ 14 to define a low energy boron ion-implant used to dope the isolation regions previously defined by the oxide/nitride windows. A high temperature drive-in is then used to diffuse the P+ regions through the n-epi region 4.

Figure 1D:
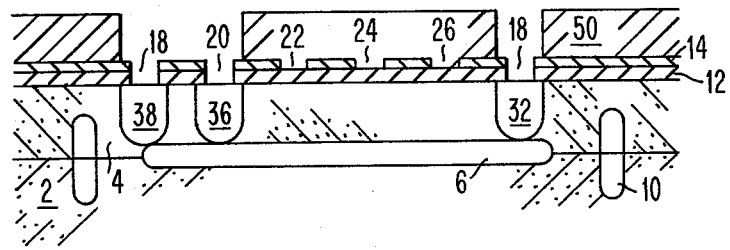
FIG. 1d is a cross-sectional view of a third stage, after FIGS. 1b and 1c, showing the N guard ring photoresist blocking layer and implant, forming N guard ring, buried N+ region contact and PNP base region.

In FIG. 1d, the next mask defines a PR blockout mask 50 for the oxide etch and N phosphorous implant which serves as reach through contact 38 to the N+ buried layer 6, as guard ring 32 for MTL transistors, as the PNP base region 36 and to form low value N resistors (75 ohms/sq). The implant is done at low energy such that the oxide/nitride windows 18 and 20 define the doped region. A subsequent reoxidation 39 is done shown in FIG. 1e which grows slightly less than the original epi reoxidation cycle 12 and diffuses the N regions 32, 36, 38 to contact the up-diffusing buried N+ region 6. During this oxidation step, the oxide 41 in the contact regions 22, 24, 26 will grow a lesser amount to give subsequent ion-implant energy loss approximatly equivalent to the oxide 12 plus nitride 14 layers.

Figure 1E:
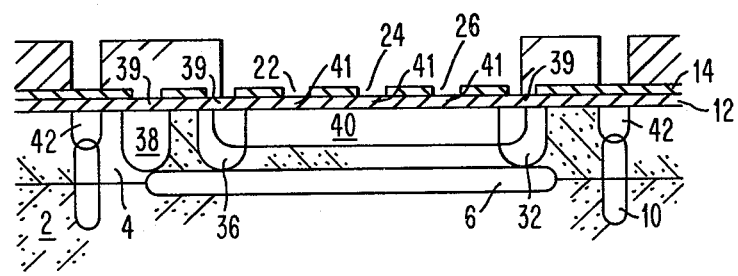
FIG. 1e is a cross-sectional view of a fourth stage, after FIG. 1d, and an intervening oxidation step, showing the NPN base photo and ionimplant, forming the NPN base, PNP collector and top isolation regions. (Note that the base is defined by photoresist and by compensation of the N guard ring. High value resistor formation is not shown).
Figure 1F:
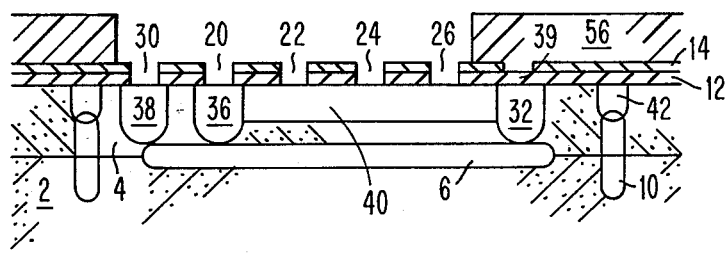
FIG. 1f is a cross-sectional view of a fifth stage, after FIG. 1e, showing the contact blocking photo, showing the formation of all contact windows. (Note contact windows are defined by $Si_3N_4$ windows except on ends of reach through contact.)

In FIG. 1e, the NPN base/PNP collector region and top isolation regions 42 are then formed by a PR masked double energy boron ion-implant. Since the P regions 40, 42 are implanted through the oxide 39, 41 and oxide 12 nitride 14 layers, the base 40 junction depth will be a function of the oxide layer 41 thickness in the contact areas 22, 24, 26 and a function of oxide 12 plus nitride 14 thickness elsewhere. By keeping the nitride layer 14 thin relative to the oxide thickness 39, the differences in base 40 junction depth can be kept small and the thinning of the base region 40 at the corners of the upward collectors 54 can be minimized. This P region 40 has a high sheet resistance (1000 ohms/sq) for low upward NPN collector-base capacitance, high PNP collector base breakdown and is used to form resistors.

In FIG. 1f, a photoresist mask 56 is used next to block the N guard ring areas 32 (if used) — and the top down only isolation region (if used) — while all contacts 20, 22, 24, 26, 30 are reopened in the $SiO_2$ layer 12. This mask 56 is used to define one or more sides of the reach-through contact window 30.

Figure 1G:
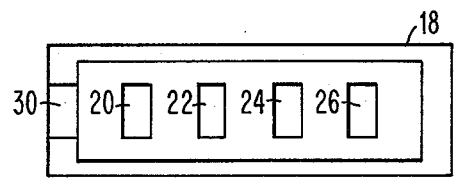
FIG. 1g is a top view after the opening of the contacts in FIG. 1f showing the definition of the contacts by the $Si_3N_4$ and the now removed photoresist.

FIG. 1g shows a top view of the nitride defined windows 20, 22, 24, 26 and the nitride/photoresist defined window 30. The previously defined $Si_3N_4$ openings serve as the etch mask for two sides of contact 30 while the block mask 56 defines the other sides. This block out mask is not needed if the N guard 32 and top only isolation are not used.

Figure 1H:
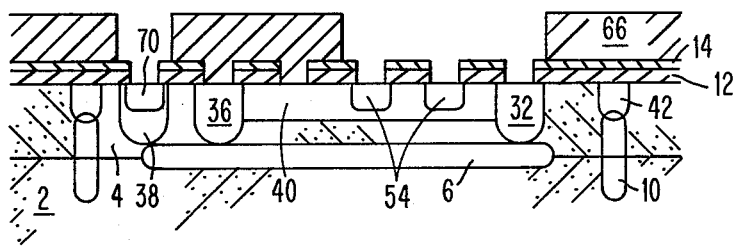
FIG. 1h is a cross-sectional view of a sixth stage, after FIGS. 1f and 1g, showing the surface N+ blocking photo and asenic implant, forming the upward N+ collectors and the ohmic contact to the PNP base/NPN buried emitter/guard ring regions. (Note implant defined by $Si_3N_4/SiO_2$ windows.)
Figure 1L:
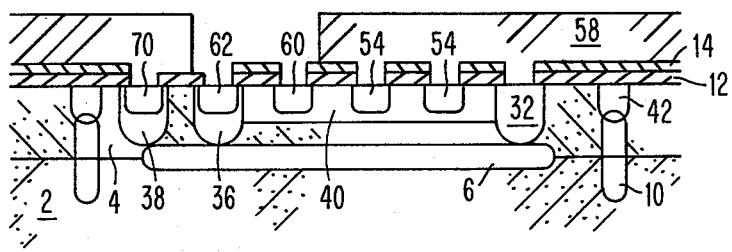
FIG. 1i is a cross-sectional view of a seventh stage, after FIG. 1h, showing the P+ emitter blocking photo and implant, forming the PNP emitter, the PNP collector/NPN base ohmic contact. (Note implant is defined by $Si_3N_4$ windows.)

The next two masking steps use a blocking photoresist to mask ion-implants. The order of the steps may be interchanged. 1. FIG. 1h shows PR mask 66 to form N+ (arsenic) NPN upward collectors 54, reach through/PNP base contact 70 regions (mask 66 is a block out — the As implant is defined by the $Si_3N_4$ 14, SiO₂ 12 opening). 2. FIG. 1*i* shows PR mask 58 to form P+ (boron) NPN base/PNP collector contact 60, PNP emitter regions 62 and P resistor contacts (mask 58 is block out, implant is defined by Si₃N₄ 14, SiO₂ 12 opening).

Following these implant steps, an anneal/drive is used to activate the implanted species and diffuse the N+ and P+ regions to the final junction depths.

The following process steps can be optional and removed if a simpler structure is satisfactory:

Top only isolation can be used instead of buried isolation.

N guard ring 32 can be eliminated, which saves block out mask 56 of FIG. 1*f*. This alternate embodiment is shown in FIGS. 3*a*–3*i*.

N reach through 38, PNP base 36 can also be eliminated, which saves mask 50 and I/I of FIG. 1*d* (latter also saves reoxidation as contacts are only opened through Si₃N₄ 14, then base I/I followed by unmasked contact etch).

The NPN base/PNP collector contact 60 and PNP emitter 62 can also be eliminated which saves mask 66 and I/I of FIG. 1*h*.

In summary, this invention provides a simplified, extendable process sequence which allows the formation of:

1. High performance NPN with reachthrough collector which is self-aligned to all contacts.
2. Double diffused lateral PNP.
3. High value resistors.
4. N guard ring self-aligned to all contacts.
5. Top isolation self-aligned to all contacts and N guard ring.

In addition, features can be eliminated from the process sequence with very little influence on the NPN and resistor characteristics.

Finally, the improved alignment features allow a denser spacing of doped regions with less stringent requirements on mask and photoresist tools/processors/operators.

FIGS. 2*a*–2*i* show the formation of an alternate structure with an asymmetric PNP emitter/base. The process sequence of steps in the formation of this structure are the same as discussed in FIGS. 1*a*–1*i*. The structure differs in that in FIG. 2*b* the guard ring 18 is widened in an area 18' where the reach through contact and PNP base 36 are later formed.

Figure 2A:
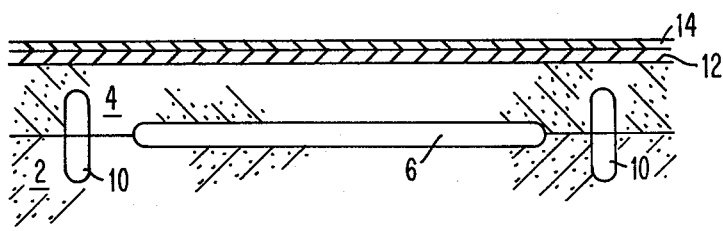
FIGS. 2a–2i show the formation of an asymmetric PNP emitter-base region using the same process sequence as FIGS. 1a–1i, where the PNP emitter and base contact are defined by a combination $Si_3N_4$ and $SiO_2$ masks whereby unwanted injection away from the collector is minimized.
Figure 2B:
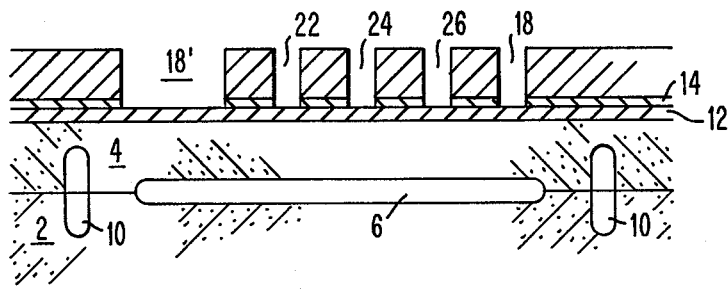
Figure 2C:
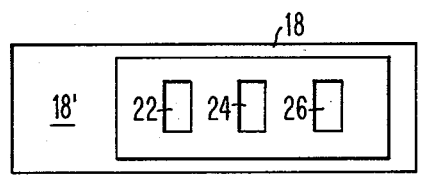
Figure 2D:
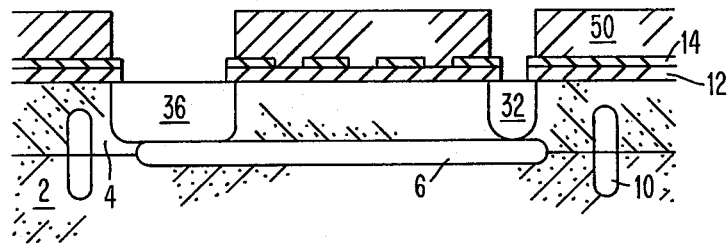
Figure 2E:
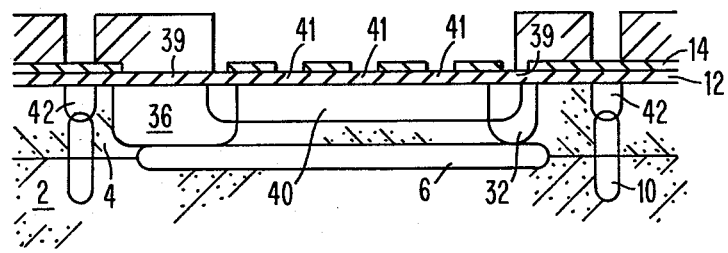
Figure 2F:
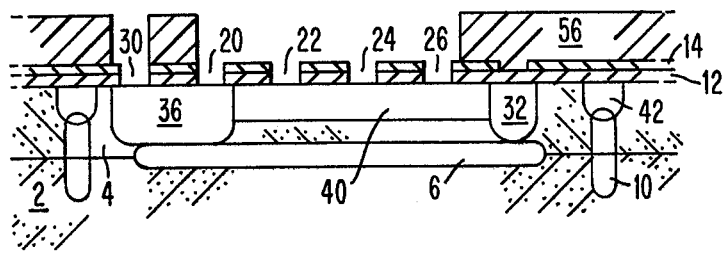
Figure 2G:
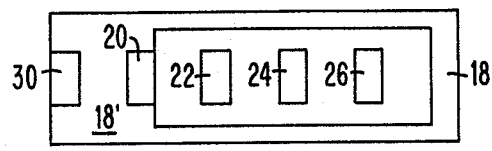
Figure 2H:
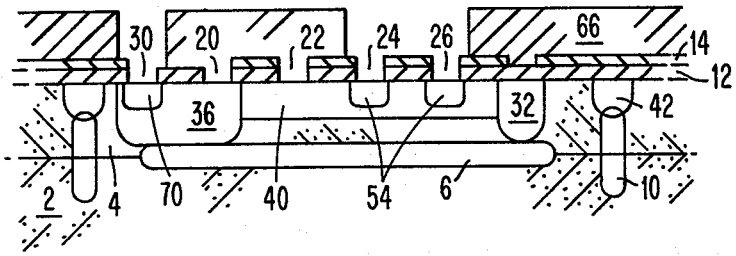
Figure 2I:
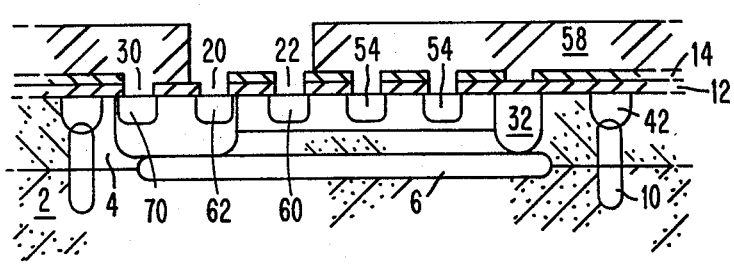

After the formation of the N guard ring 32 and N reach through/PNP base 36, and after the reoxidation 39 and the formation of the NPN base/PNP collector 40 and top isolation regions 42, the photo masking layer 56 in FIG. 2*f* is used to block the N guard ring (if used) and to define one or more sides of the PNP emitter window 20 and of the reach through contact 30.

The remainder of the structure is unchanged.

Figure 3A:
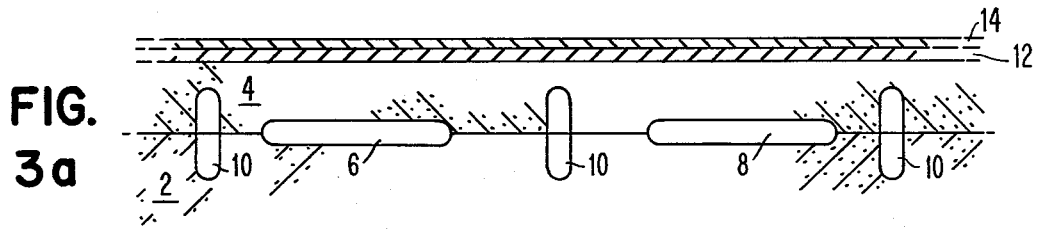
FIGS. 3a–3i show an alternate embodiment of the invention for the formation of NPN and PNP devices where the N reach through is formed only in the contact window whereby it is not used as a guard ring.

FIGS. 3*a*–3*i* show an alternate process sequence for the formation of NPN and PNP devices whereby the N guard ring is eliminated and a mask layer is saved. Proceeding as before:

In FIG. 3*a*, the process follows conventional masking and doping (diffusion or ion-implant) and deposition techniques to form the N+ 6, 8 and P+ 10 buried regions, N-epitaxial layer 4, on substrate 2, epi reoxidation 12, and Si₃N₄ layer 14.

Figure 3B:
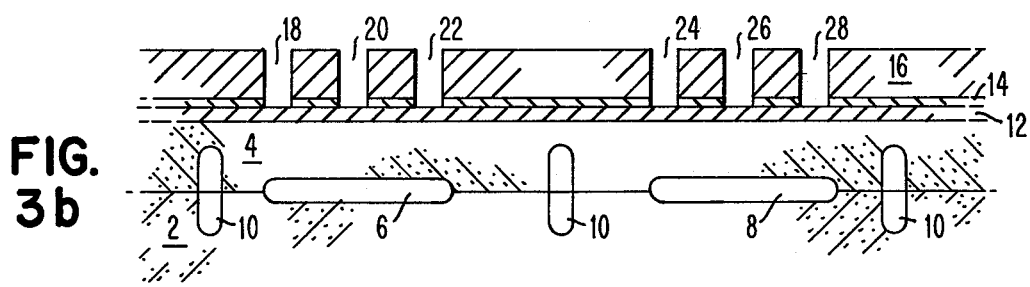
Figure 3C:
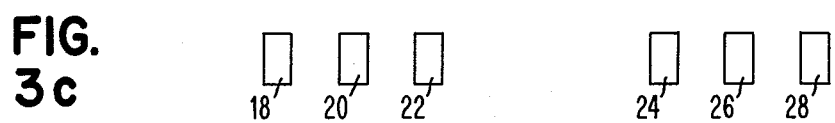

In FIG. 3*b*, all contact holes 18, 20, 22, 24, 26, 28 are etched (RIE preferred) through Si₃N₄ 14 using photoresist mask 16. The top view of this mask is shown in FIG. 3*c*.

Figure 3D:
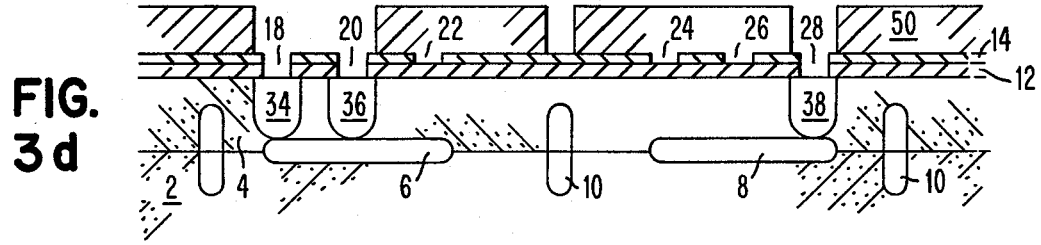
Figure 3E:
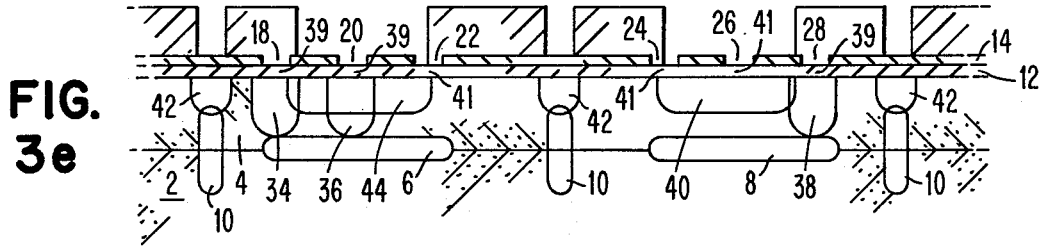

In FIG. 3*d*, the next mask defines a PR blockout mask 50 for the oxide etch and N phosphorous implant, which serves as reach through contacts 34, 38 to the N+ buried layers 6, 8, respectively, and as PNP base region 36, and to form low value N resistors (75 ohms/sq). The implant is done at low energy such that the oxide/nitride windows 18, 20, 28 define the doped regions. A subsequent reoxidation 39 shown in FIG. 3*e* is done which grows slightly less than the original epi reoxidation cycle 12 and diffuses the N regions 34, 36, 38 to contact the updiffused buried N+ regions 6 and 8. During this oxidation step, the oxide 41 in the contact regions 22, 24, 26 will grow a lesser amount to give ion energy loss approximately equivalent to the oxide 12 plus nitride 14 layers.

In FIG. 3*e*, the NPN base 40, PNP collector 44, and top isolation regions 42 are then formed by a PR masked double energy boron ion-implant. The boron is implanted through the oxide 39, 41 and oxide 12 nitride 14 layers. Note that the regions 40, 44 need not overlap their respective contact windows 24, 22 and that their intersection with the N regions 38, 34, respectively, is not critical since the P regions 40, 44 are compensated by the N regions 38, 34. For decreased capacitance between these P and N regions 40 and 38, 44 and 34, they may be spaced apart with a slight increase in device size. The P region 40 has a high sheet resistance (1000 ohms/sq) for low NPN emitter-base capacitance, high PNP collector-base breakdown, and is used to form resistors.

Figure 3F:
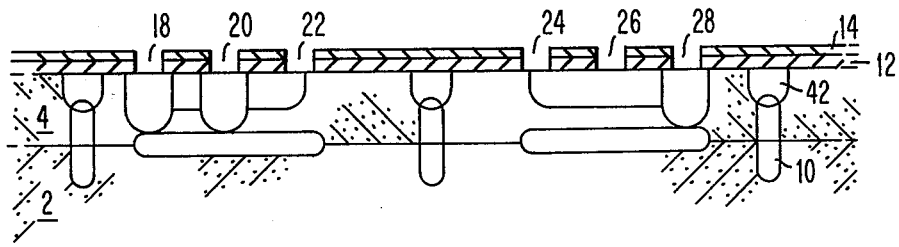

In FIG. 3*f*, all contact holes 18, 20, 22, 24, 26, 28 are etched through the SiO₂ 39, 41, with the Si₃N₄ layer 14 serving to mask the etch. No photo mask layer is needed for this etch since no guard rings are used.

Figure 3G:

FIG. 3*g* shows the top view of the Si₃N₄ defined SiO₂ windows 18, 20, 22, 24, 26, 28.

The next two steps use a blocking photoresist to mask ion-implants. The order of the steps may be interchanged.

Figure 3H:
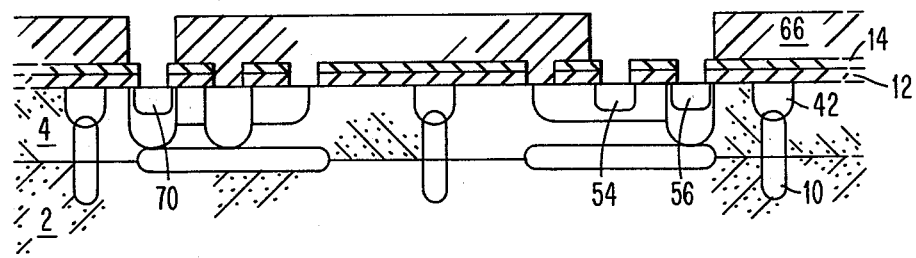
Figure 3I:
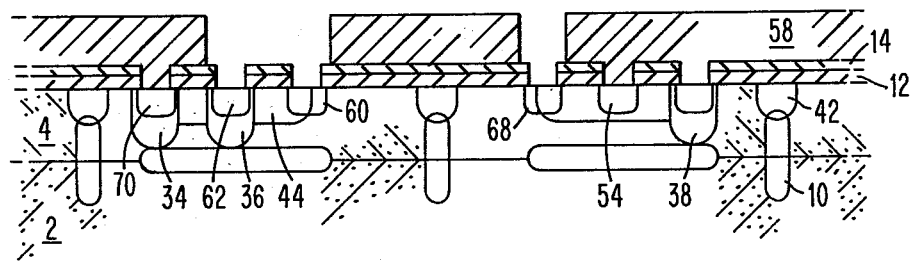

1. FIG. 3*h* shows use of a PR mask 66 to form N+ (arsenic) NPN emitter 54, collector/reach through contact 56, and PNP base/reach through contact 70. (Mask 66 is a blockout, implant is defined by Si₃N₄ 14/SiO₂ 12 openings.)
2. FIG. 3*i* shows use of a PR mask 58 to form P+ (boron) PNP emitter 62, collector contact 60, and NPN base contact 68 (mask 58 is a blockout, implant is defined by Si₃N₄ 14/SiO₂ 12 openings.)

Following these implant steps, an anneal/drive is used to activate the implanted species and diffuse the N+ and P+ regions to the final junction depths.

The following process steps can be optional and removed if a simpler structure is satisfactory:

N reach through 34, 38, PNP base 36 can be eliminated which saves mask 50, etch and ion-implant of FIG. 3*d* as well as subsequent reoxidation since contacts are only etched through the thin Si₃N₄ layer 14.

The NPN base contact 68, PNP emitter 62 and PNP collector contact 60 may also be eliminated which saves mask 66 and I/I of FIG. 3*h*.

While the invention has been particularly shown and described with reference to the preferred embodiments thereof, it will be understood by those skilled in the art that the foregoing and other changes in form and details may be made therein without departing from the spirit and scope of the invention.

We claim:

1. A process for forming a double diffused lateral PNP transistor in a semiconductor substrate of a first conductivity type having a buried diffusion of said first conductivity type, comprising the steps of:

forming a silicon oxide passivation layer on the surface of said substrate;

forming a silicon nitride masking layer on the surface of said silicon oxide layer;

forming a first window for the emitter and base, a second window the collector contact, and a third window for the base contact by etching through said silicon nitride and silicon oxide layers above said buried region, employing a single masking step;

selectively covering said second window with a blocking layer and ion-implanting a base region of said first conductivity type through said first window and a base contact of said first conductivity type through said third window, to contact said buried region;

reforming an oxide layer in said first, second and third windows;

selectively covering said third window with a blocking layer having an opening over said first and second windows and ion-implanting a collector region of a second conductivity type opposite to said first conductivity type in the substrate beneath said opening in said second blocking layer;

selectively covering with a third blocking layer said third window and forming an emitter region of said second conductivity type through said first window within said base region, and a collector contact of said second conductivity type through said second window, in said collector region;

whereby a minimum size double diffused lateral PNP device is formed with a minimum number of hot processing steps.

2. A process for forming a double diffused lateral PNP transistor having an asymmetrically positioned emitter within the base region for enhanced injection efficiency in the vicinity of the collector, the device being formed in a semiconductor substrate of a first conductivity type having a buried region of said first conductivity type, comprising the steps of:

forming an oxide passivation layer on the surface of said substrate;

forming a silicon nitride layer on the surface of said silicon oxide layer;

etching said nitride layer to form a first window for the base region and a second window for the collector contact over said buried regions;

etching said oxide layer through said first window in said nitride layer;

forming a base region of said first conductivity type through said first window;

reoxidizing the silicon exposed through said first window;

forming a first blocking layer over said oxide and nitride layers having an opening over portions of said first and second window in said nitride layer;

forming a collector region of a second conductivity type opposite from said first conductivity type through said opening in said first blocking masks;

masking an etching to define an island region in said silicon dioxide formed in said first window which defines a third window through said silicon dioxide as a base contact window and a fourth window as an emitter contact window, said fourth window having its other side defined by the edge of said first window;

selectively blocking said third window with a second blocking layer and forming an emitter region of said second conductivity type through said fourth window and a collector contact region of said second conductivity type through said second window;

whereby said emitter is asymmetrically positioned within said base region to enhance the injection efficiency in the vicinity of said collector by means of a process having a minimum number of hot processing steps.

3. A process for forming merged upward injecting NPN and double diffused lateral PNP transistor on a semiconductor substrate of a first conductivity type having an epitaxial layer of a second conductivity type, a buried diffusion of said second conductivity type, comprising the steps of:

forming a silicon oxide passivation layer on the surface of said epitaxial layer;

forming a silicon nitride layer on the surface of said silicon oxide layer;

forming a first window for the guard ring, a second window for the base, a third window for the merged collector/base contact, and at least a fourth window for one or more upward NPN collectors by etching through said silicon nitride layer and leaving unetched said silicon oxide layers above said buried region, employing a single masking step;

selectively covering said third and fourth windows with a blocking layer, etching said SiO$_2$ layer exposed in said first and second windows in the said nitride layer, forming a guard ring region of said second conductivity type through said first window and a base region of said second conductivity type through said second window, to contact said buried region;

reforming an oxide layer in said first and second windows;

forming a masking layer on said silicon oxide and silicon nitride layers and ion-implanting a merged base/collector region of said first conductivity type through said silicon oxide and silicon nitride layers, said masking layer having one edge coincident with or overlapping one edge of said second window where said merged base/collector region is a lateral collector and having three edges coincident with or overlapping three edges of the said guard ring in said first window where said merged base/collector region is a base of the upward injecting device;

selectively covering with a second blocking layer portions of said first nitride window which serve as a guard ring and etching said oxide layer exposed by a portion of said first nitride window where contact to said buried layer is made and all of said second, third and fourth nitride windows where lateral emitter, lateral collector/vertical base contact, and upward collector respectively are formed;

selectively covering with a third blocking layer said second and third windows and ion-implanting an upward collector region of said second conductivity type in said fourth window and an ohmic contact of said second conductivity type in said contact portion of said first window, said implant done at low energy such that said oxide and oxide/nitride layers block said implant except where said windows have been opened;

selectively covering with a fourth blocking layer said contact portion of said first window and said fourth window and ion-implanting a lateral emitter of said first conductivity type in said second window and an ohmic merged collector/base contact of said first conductivity type in said third window;

whereby minimum size self-aligned merged upward injecting NPN and double diffused lateral PNP devices are formed with a minimum number of critical masks and hot processing steps.

4. A process for forming a double diffused lateral PNP transistor having an asymmetrically positioned emitter within the base region for enhanced injection efficiency in the vicinity of the collector, the device being formed on a semiconductor substrate of a first conductivity type having an epitaxial layer of a second conductivity type, a buried region of said second conductivity type, comprising the steps of:

forming an oxide passivation layer on the surface of said epitaxial layer;

forming a silicon nitride layer on the surface of said silicon oxide layer;

etching said nitride layer to form a first window for the base region and a second window for the collector contact over said buried regions;

forming a first blocking layer to selectively cover said second window and etching said oxide layer through said first window in said nitride layer;

forming a base region of said first conductivity type through said first window;

reoxidizing the silicon exposed through said first window;

forming a masking layer over said oxide and nitride layers having an opening over portions of said first and second window in said nitride layer;

forming a collector region of said first conductivity type by ion-implanting through said oxide and oxide/nitride layers in said opening in said masking layer;

selectively covering a portion of said first window with a second blocking layer and etching to define an island region in said silicon dioxide formed in said first window which defines a third window through said silicon dioxide as a base contact window and a fourth window as an emitter contact window, said fourth window having its other side defined by the edge of said first window;

selectively covering said second and fourth windows with a third blocking layer and ion-implanting a base contact region of said second conductivity type in said third window;

selectively covering said third window with a fourth blocking layer and ion-implanting an emitter region of said first conductivity type in said fourth window and a collector contact region of said first conductivity type in said second window;

whereby said emitter is asymmetrically positioned within said base region to enhance the injection efficiency in the vicinity of the said collector by means of a process having a minimum of critical masks and hot processing steps.

5. A process for making vertical NPN and double diffused lateral PNP transistors on a semiconductor substrate of a first conductivity type having an epitaxial layer of a second conductivity type, buried diffusions of said second conductivity type, comprising the steps of:

forming a silicon oxide passivation layer on the surface of said epitaxial layers;

forming a silicon nitride layer on the surface of said silicon oxide layer;

forming a first window for the PNP base contact, a second window for the PNP emitter contact, a third window for the PNP collector contact, a fourth window for the NPN base contact, a fifth window for the NPN emitter and a sixth window for the NPN collector reach through contact by etching through said silicon nitride layer above said buried regions, employing a single masking step;

selectively covering said third, fourth, fifth windows with a blocking layer and etching said silicon oxide layer through said first, second and sixth silicon nitride windows;

forming a base reachthrough region of said second conductivity type in said first window, a base region of said second conductivity type in said second window and a collector reach through region of said second conductivity type in said sixth window;

reforming an oxide layer in said first, second and sixth windows;

forming a masking layer on said silicon oxide and silicon nitride surfaces which has a first opening over said second window and is coincident or overlapping said third window and has a second opening overlapping said fifth window and is adjacent to or overlapping said fourth window;

ion-implanting a collector region of said first conductivity type through said oxide, and said oxide/nitride layers in said first opening and a base region of said first conductivity type in said second opening;

etching said silicon dioxide which is exposed in said silicon nitride windows one, two, three, four, five, six;

selectively covering said second, third, and fourth windows with a second blocking layer and ion-implanting a base contact in said first window, an emitter in said fifth window and a collector contact in said sixth window all of said second conductivity type;

selectively covering said first, fifth and sixth windows with a third blocking layer and ion-implanting an emitter region in said second window, a collector-contact in said third window, and a base contact in said fourth window all with said first conductivity type;

annealing at an elevated temperature to activate the implanted species and diffuse the regions to the final junction depths;

whereby a minimum sized NPN and a minimum sized double diffused lateral PNP are formed with a minimum number of critical masks and hot processing steps.

6. A process for making vertical NPN and double diffused lateral PNP transistors on a semiconductor substrate of a first conductivity type having an epitaxial layer of a second conductivity type, buried diffusions of said second conductivity type, comprising the steps of:

forming a silicon oxide passivation layer on the surface of said epitaxial layers;

forming a silicon nitride layer on the surface of said silicon oxide layer;

forming a first window for the PNP base contact, a second window for the PNP emitter contact, a third window for the PNP collector contact, a fourth window for the NPN base contact, a fifth window for the NPN emitter and a sixth window for the NPN collector reachthrough contact by etching through said silicon nitride layer and silicon oxide layer above said buried regions, employing a single masking step;

selectively covering said third, fourth, fifth windows with a blocking layer and etching said silicon oxide layer through said first, second and sixth silicon nitride windows;

forming a base reachthrough region of said second conductivity type in said first window, a base region of said second conductivity type in said second window and a collector reachthrough region of said second conductivity type in said sixth window;

forming a masking layer on said silicon oxide and silicon nitride surfaces which has a first opening over said second window and is coincident or overlapping said third window and has a second opening overlapping said fifth window and is adjacent to or overlapping said fourth window;

ion-implanting a collector region of said first conductivity type through said oxide, and said oxide/nitride layers in said first opening and a base region of said first conductivity type in said second opening;

selectively covering said second, third, and fourth windows with a second blocking layer and ion-implanting a base contact in said first window, an emitter in said fifth window and a collector contact in said sixth window all of said second conductivity type;

selectively covering said first, fifth and sixth windows with a third blocking layer and ion-implanting an emitter region in said second window, a collector-contact in said third window, and a base contact in said fourth window all with said first conductivity type;

annealing at an elevated temperature to activate the implanted species and diffuse the regions to the final junction depths;

whereby a minimum sized NPN and a minimum sized double diffused lateral PNP are formed with a minimum number of critical masks and hot processing steps.

* * * * *